United States Patent
Hsiao et al.

(10) Patent No.: US 7,749,821 B2
(45) Date of Patent: Jul. 6, 2010

(54) METHOD OF FABRICATING PIXEL STRUCTURE

(75) Inventors: Hsiang-Chih Hsiao, Keelung (TW); Chih-Chun Yang, Hsinchu County (TW); Chin-Yueh Liao, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 12/489,451

(22) Filed: Jun. 23, 2009

(65) Prior Publication Data

US 2010/0087021 A1    Apr. 8, 2010

(30) Foreign Application Priority Data

Oct. 6, 2008    (TW) .............................. 97138398 A

(51) Int. Cl.
    *H01L 21/28*    (2006.01)
(52) U.S. Cl. ................................ 438/151; 257/E21.001
(58) Field of Classification Search ................... 438/30, 438/751, 141–151, 738–739
    See application file for complete search history.

(56) References Cited

U.S. PATENT DOCUMENTS

| | | | |
|---|---|---|---|
| 7,602,456 B2 * | 10/2009 | Tanaka et al. ................. | 349/43 |
| 2005/0078254 A1 | 4/2005 | Lim et al. | |
| 2006/0145161 A1 * | 7/2006 | Lee et al. ....................... | 257/72 |
| 2006/0146213 A1 | 7/2006 | Ahn et al. | |
| 2006/0146245 A1 | 7/2006 | Ahn et al. | |
| 2008/0122767 A1 | 5/2008 | Lim et al. | |
| 2008/0239227 A1 * | 10/2008 | Fan Jiang et al. ........... | 349/144 |
| 2008/0297708 A1 * | 12/2008 | Yang et al. .................. | 349/136 |
| 2009/0168003 A1 * | 7/2009 | Liu et al. ..................... | 349/129 |

* cited by examiner

*Primary Examiner*—Savitri Mulpuri
(74) *Attorney, Agent, or Firm*—Jianq Chyun IP Office

(57) ABSTRACT

A method of fabricating a pixel structure includes first forming a first, a second, and a third dielectric layers over an active device and a substrate. Etching rates of the first and the third dielectric layers are lower than an etching rate of the second dielectric layer. A contact opening exposing a portion of the active device is formed in the third, the second, and the first dielectric layers. The third and the second dielectric layers are patterned to form a number of stacked structures. An electrode material layer is formed and fills the contact opening. The electrode material layer located on the stacked structures and the electrode material layer located on the first dielectric layer are separated. The stacked structures and the electrode material layer thereon are simultaneously removed to define a pixel electrode and to form at least an alignment slit in the pixel electrode.

11 Claims, 9 Drawing Sheets

METHOD OF FABRICATING PIXEL STRUCTURE

CROSS-REFERENCE TO RELATED APPLICATION

This application claims the priority benefit of Taiwan application serial no. 97138398, filed on Oct. 6, 2008. The entirety of the above-mentioned patent application is hereby incorporated by reference herein and made a part of specification.

BACKGROUND OF THE INVENTION

1. Field of the Invention

The present invention relates to a method of fabricating a pixel structure, and more particularly to a method of fabricating a pixel structure in which an alignment slit is formed.

2. Description of Related Art

In a method of fabricating a conventional pixel structure in a liquid crystal display (LCD) panel, five photomasks are required in most cases. The first photomask is used to define patterns of a first metal layer for forming scan lines and gates of active devices. The second photomask is used to define a channel layer and an ohmic contact layer of the active devices. The channel layer and the ohmic contact layer are collectively referred to as a semiconductor layer. The third photomask is used to define patterns of a second metal layer for forming data lines and sources/drains of the active devices. The fourth photomask is used to pattern a dielectric layer above the second metal layer. The fifth photomask is used to pattern an electrode material layer for forming pixel electrodes.

Besides, consumers are in pursuit of large-sized LCD panels and wide-view-angle performance. At present, one of the most common LCD panels with wide-view-angle performance is a multi-domain vertical alignment (MVA) LCD panel in which alignment slits are disposed to tilt liquid crystal molecules in different regions towards various directions, thereby achieving the wide-view-angle performance. When the fifth photomask is used to pattern the electrode material layer as stated above, the pixel electrode equipped with the alignment slits can be formed.

Nonetheless, costs of the photomasks are rather high, and therefore the number of photomasks becomes a decisive factor of the manufacturing costs. Additionally, with the development of the large-sized LCD panels, dimensions of photomasks are increased as well, thus giving rise to an increase in the costs of the photomasks. Hence, manufacturers are dedicated to the reduction of the required number of photomasks.

SUMMARY OF THE INVENTION

The present invention is directed to a method of fabricating a pixel structure in which fewer photomasks are required for forming alignment slits.

To embody the present invention, a method of fabricating a pixel structure is provided. The method includes first forming an active device on a substrate. Next, a first dielectric layer, a second dielectric layer, and a third dielectric layer are sequentially formed on the active device and the substrate. Etching rates of the first dielectric layer and the third dielectric layer are lower than an etching rate of the second dielectric layer. Afterwards, a contact opening exposing a portion of the active device is then formed in the third, the second and the first dielectric layers. Thereafter, the third dielectric layer and the second dielectric layer are patterned to form a plurality of stacked structures. After that, an electrode material layer is formed and covers the stacked structures, the first dielectric layer, and the contact opening Here, the electrode material layer located on the stacked structures and the electrode material layer located on the first dielectric layer are separated. The stacked structures and the electrode material layer thereon are then simultaneously removed, so as to define a pixel electrode and to form at least an alignment slit in the pixel electrode.

In one embodiment of the present invention, a width of the third dielectric layer of the stacked structures is greater than a width of the second dielectric layer of the stacked structures.

In one embodiment of the present invention, the steps of forming the contact opening and patterning the third dielectric layer and the second dielectric layer include first forming a patterned photoresist layer on the third dielectric layer. The patterned photoresist layer has a thin portion and a thick portion. The contact opening is then formed in the third dielectric layer, the second dielectric layer, and the first dielectric layer with use of the patterned photoresist layer as a mask. Next, a thickness of the patterned photoresist layer is reduced so that the thin portion of the patterned photoresist layer is removed, while the thick portion of the patterned photoresist layer is remained. Thereafter, the exposed third dielectric layer and the exposed second dielectric layer are removed with use of the thick portion of the patterned photoresist layer as a mask, so as to form the stacked structures. The patterned photoresist layer is then removed.

In one embodiment of the present invention, the step of forming the patterned photoresist layer includes using a half-tone mask or a gray-tone mask.

In one embodiment of the present invention, densities of the first dielectric layer and the third dielectric layer are greater than a density of the second dielectric layer. In one embodiment, materials of the first dielectric layer and the third dielectric layer are the same as a material of the second dielectric layer.

In another embodiment of the present invention, materials of the first dielectric layer and the third dielectric layer are different from a material of the second dielectric layer.

In one embodiment of the present invention, the step of removing the stacked structures includes using an etching gas.

In one embodiment of the present invention, the step of removing the stacked structures includes using carbon dioxide in an equilibrium that solid, liquid and gas phases are coexist.

In one embodiment of the present invention, materials of the first dielectric layer, the second dielectric layer, and the third dielectric layer include silicon-based materials. In one embodiment, the step of removing the stacked structures includes using a hydrofluoric acid etching gas.

According to said method of fabricating the pixel structure of the present invention, the first, the second, and the third dielectric layers having different etching rates can be used to define the pixel electrode and the alignment slit of each of the pixel structures. In addition, the contact opening and the pixel electrode in the pixel structure are formed with use of the same photomask, and therefore the required number of photomasks can be reduced by conducting said method of fabricating the pixel structure of the present invention.

In order to make the aforementioned and other features and advantages of the present invention more comprehensible, an embodiment accompanied with figures is described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1:
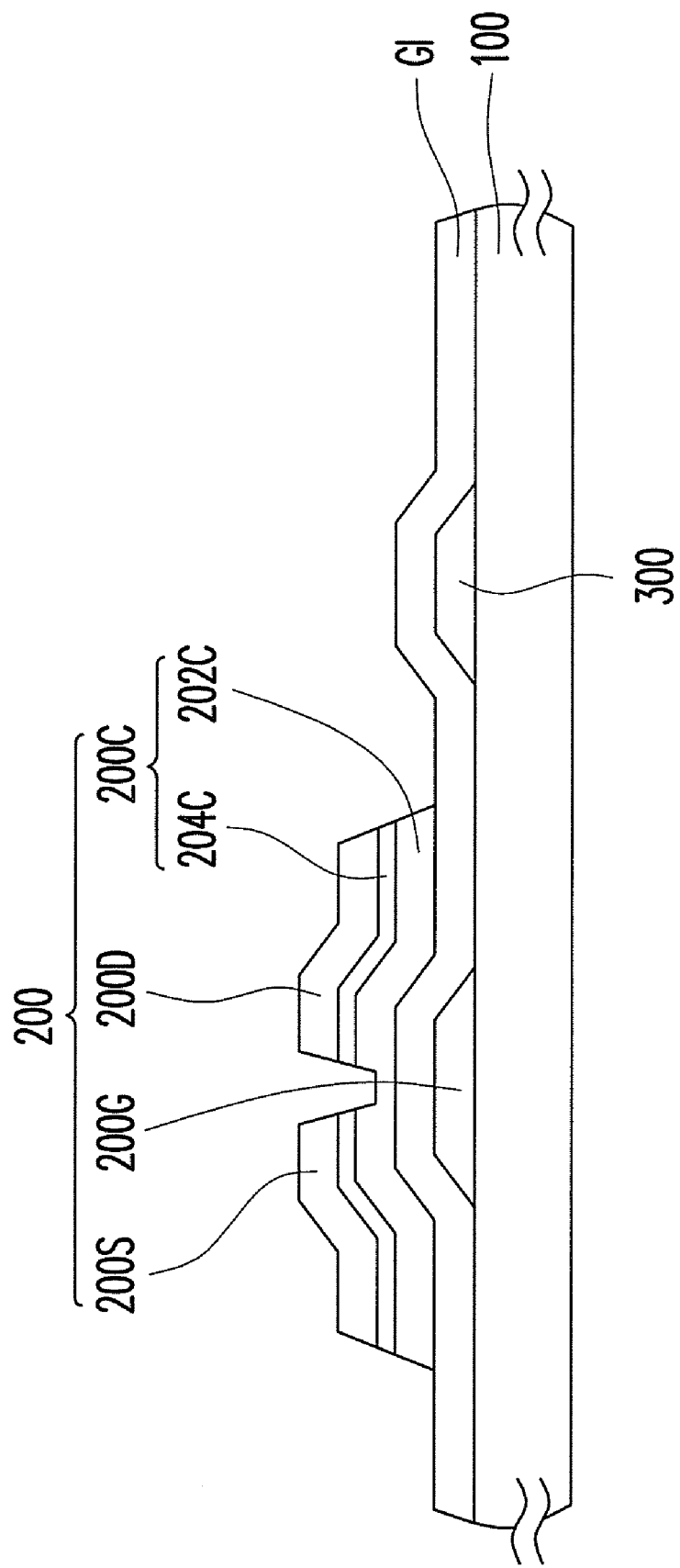
FIGS. 1 through 9 are schematic cross-sectional views for depicting the steps of a process of fabricating a pixel structure according to an embodiment of the present invention.

FIGS. 1 through 9 are schematic cross-sectional views for depicting the steps of a process of fabricating a pixel structure according to an embodiment of the present invention. In order to explain easily, only a portion of a pixel structure is shown in FIGS. 1 to 9. Referring to FIG. 1, an active device 200 is formed on a substrate 100 at first. In a preferred embodiment, the step of forming the active device 200 is performed with use of two photomasks, for example. A first metal layer (not shown) is first formed on the substrate 100, for example, and the substrate 100 is made of a transparent material, such as glass, quartz, plastic, and so forth. The first metal layer is then patterned to form a gate 200G of the active device 200. Here, the first metal layer is formed by performing a sputtering process, an evaporation process, or other thin film deposition processes, for example, and the first metal layer is patterned with use of one photomask, for example. Besides, if a storage capacitor is to be disposed in the pixel structure, an electrode pattern 300 can be selectively formed on the substrate 100 in the pixel structure during the formation of the gate 200G. Here, the electrode pattern 300 can serve as a lower electrode of the storage capacitor.

Next, a semiconductor layer 200C, a source 200S, and a drain 200D of the active device 200 can be formed on the substrate 100. Specifically, a gate insulation layer GI, a semiconductor layer (not shown), and a second metal layer (not shown) are sequentially formed on the substrate 100 at first. Here, the gate insulation layer GI, the semiconductor layer, and the second metal layer cover the gate 200G, the electrode pattern 300, and the entire substrate 100, for example. The gate insulation layer GI is, for example, made of a dielectric material, such as silicon nitride, silicon oxide, silicon oxynitride, or a stacked layer comprising said materials. In addition, the gate insulation layer GI is formed by performing a chemical vapor deposition (CVD) process or other appropriate thin film deposition processes.

On the other hand, the semiconductor layer of the present embodiment includes a channel material layer (not shown) and an ohmic contact material layer (not shown) located above the channel material layer. The channel material layer and the ohmic contact material layer are respectively made of amorphous silicon and heavily doped n-type amorphous silicon, for example. Besides, the channel material layer and the ohmic contact material layer are formed by implementing a CVD process, for example.

Thereafter, the semiconductor layer and the second metal layer are patterned. In the present embodiment, the semiconductor layer and the second metal layer are patterned with use of a photomask, such as a gray-tone mask or a half-tone mask having regions with different light transmittance rates. Here, the gray-tone mask or the half-tone mask includes a transparent region having a 100% light transmittance rate, a non-transparent region having a 0% light transmittance rate, and a semi-transparent region. With use of the gray-tone mask or the half-tone mask, the semiconductor layer 200C (including a channel layer 202C and an ohmic contact layer 204C), the source 200S, and the drain 200D of the active device 200 can then be defined. To prevent electrical properties of the active device 200 from being affected by short circuits occurring between the source 200S and the drain 200D due to the ohmic contact layer 204C disposed above the channel layer 202C, the ohmic contact layer 204C exposed by the source 200S and the drain 200D is removed during the formation of the source 200S and the drain 200D. Up to here, the fabrication of the active device 200 in the present embodiment is approximately completed.

In the conventional method of manufacturing the pixel structure, two photomasks are required for forming the semiconductor layer, the source, and the drain of the active device. However, in the present embodiment, the semiconductor layer 200C, the source 200S, and the drain 200D can be formed by using only one photomask, such that the other photomask required in said conventional method can be omitted. Besides, in the present invention, the active device 200 can also be manufactured in different ways upon actual demands or other considerations. For instance, the number of photomasks can be reduced by performing a laser ablation process or a lift off process, which should not be otherwise construed as a limitation to the present invention. Additionally, the active device 200 can have a bottom gate structure as provided in the present embodiment, a top gate structure, or other structures that are not provided herein.

Figure 2:
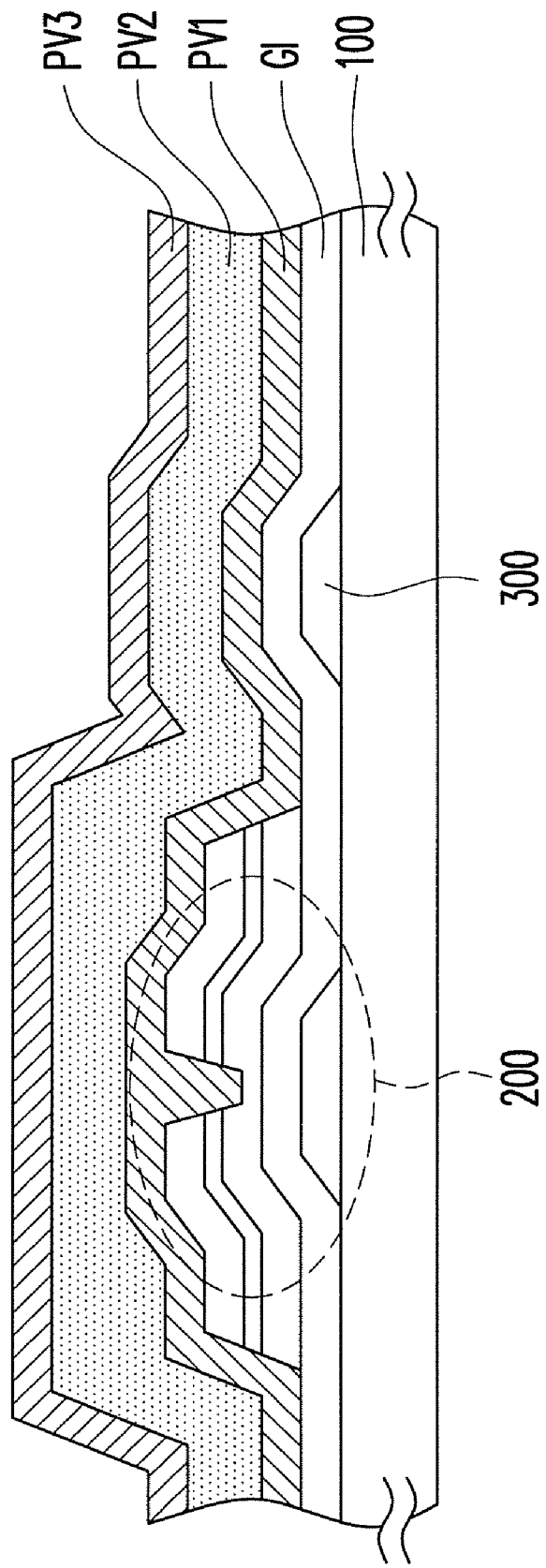

Next, referring to FIG. 2, a first dielectric layer PV1, a second dielectric layer PV2, and a third dielectric layer PV3 are sequentially formed on the substrate 100. The first dielectric layer PV1, the second dielectric layer PV2, and the third dielectric layer PV3 cover the active device 200. Note that etching rates of the first dielectric layer PV1 and the third dielectric layer PV3 are lower than an etching rate of the second dielectric layer PV2, and the first dielectric layer PV1, the second dielectric layer PV2, and the third dielectric layer PV3 are, for example, made of the same material, such as a silicon-based material. Moreover, in the present embodiment, densities of the first dielectric layer PV1 and the third dielectric layer PV3 are higher than a density of the second dielectric layer PV2 and, therefore, the etching rates of the first dielectric layer PV1 and the third dielectric layer PV3 can be lower than the etching rate of the second dielectric layer PV2. Nevertheless, in other embodiments, by differentiating the materials of the first dielectric layer PV1 and the third dielectric layer PV3 from the material of the second dielectric layer PV2, the etching rates of the first dielectric layer PV1 and the third dielectric layer PV3 can be also lower than the etching rate of the second dielectric layer PV2.

Figure 3:
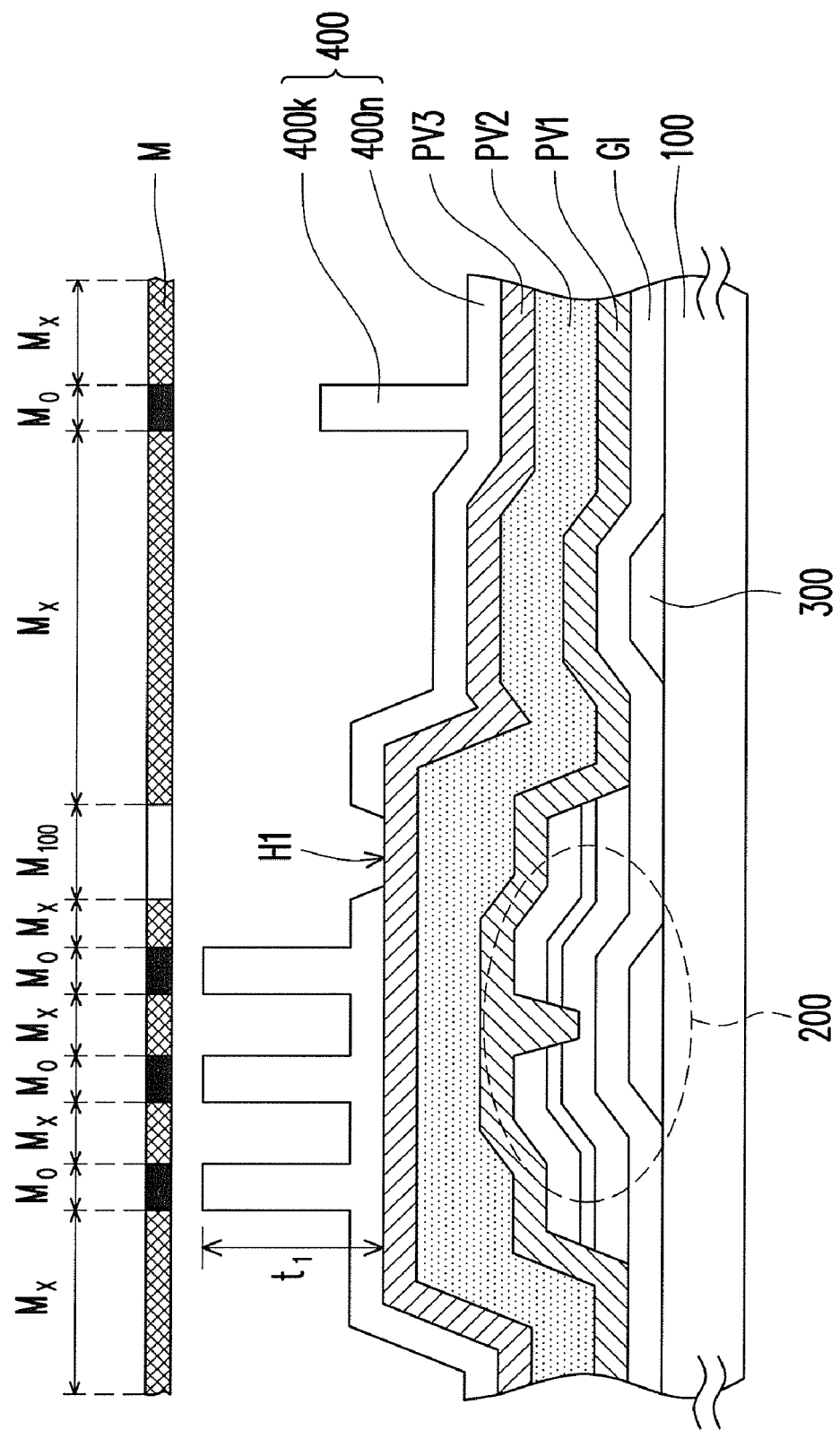

Thereafter, referring to FIG. 3, a patterned photoresist layer 400 is formed on the third dielectric layer PV3. The patterned photoresist layer 400 has a thick portion 400k and a thin portion 400n, and the thick portion 400k has a thickness $t_1$. In the present embodiment, the patterned photoresist layer 400 is made of a positive photoresist, for example. Besides, the patterned photoresist layer 400 is formed by performing a spin coating process, a slit/spin coating process, or a spin-less coating process to coat a photosensitive material layer onto the third dielectric layer PV3, for example. After that, a half-tone mask M or a gray-tone mask M having regions with different light transmittance rates is used to expose the photosensitive material layer, and then the exposed photosensitive material layer is developed to formed the patterned photoresist layer. Here, the gray-tone mask M or the half-tone mask M includes a transparent region $M_{100}$ corresponding to an opening H1 and having a 100% light transmittance rate, a non-transparent region $M_0$ corresponding to the thick portion 400k and having a 0% light transmittance rate, and a semi-transparent region $M_x$ corresponding to the thin portion 400n.

Figure 4:
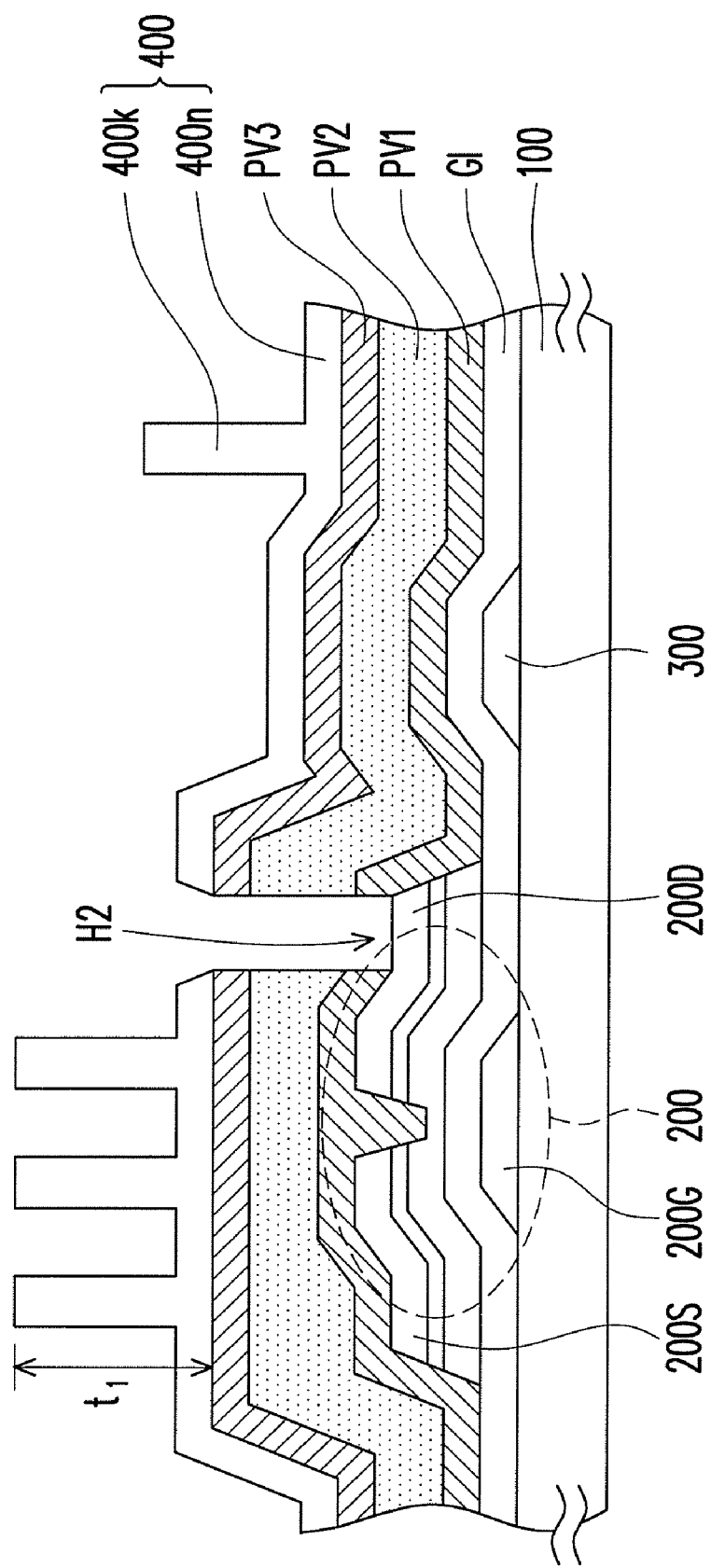

Based on the above, an etching process is then carried out with use of the patterned photoresist layer 400 as a mask, such that the third dielectric layer PV3, the second dielectric layer PV2, and the first dielectric layer PV1 corresponding the opening H1 are removed. The etching process can be referred to as a dry etching process, a wet etching process, or both of the two etching processes. As shown in FIG. 4, a contact opening H2 can then be formed in the third dielectric layer PV3, the second dielectric layer PV2, and the first dielectric layer PV1. The contact opening H2 exposes a portion of the active device 200, and the exposed portion serves as the drain 200D of the active device 200. According to the present embodiment, the formation of the contact opening H2 allows the drain 200D to be electrically connected to a pixel electrode in subsequent manufacturing processes.

Figure 5:
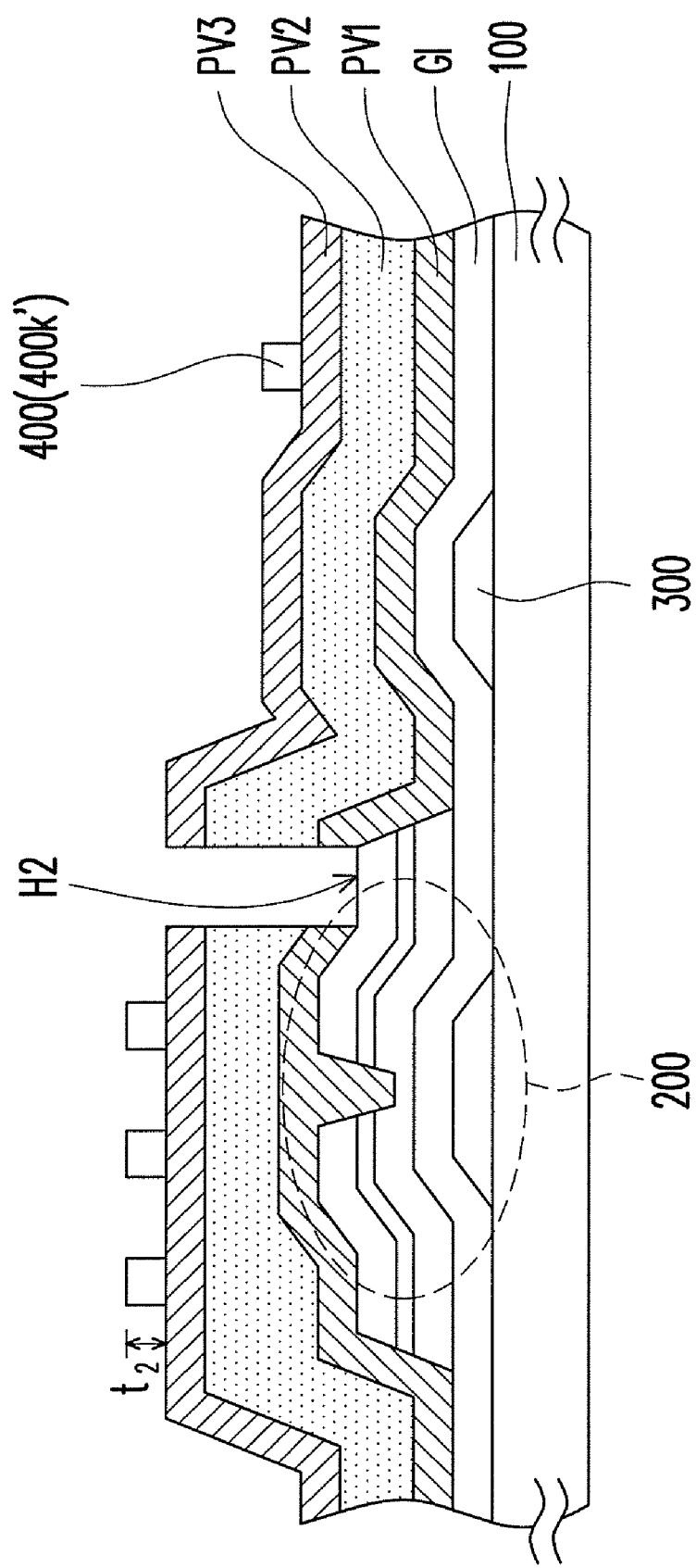

Afterwards, the thickness of the patterned photoresist layer 400 continues to be reduced until the thin portion 400n of the patterned photoresist layer 400 is removed. A thick portion 400k' as shown in FIG. 5 is remained. In the present embodiment, the thickness of the patterned photoresist layer 400 is reduced by performing an ashing process with use of oxygen plasma, for example. However, the thickness $t_1$ of the thick portion 400k is reduced during the implementation of the ashing process, such that the thick portion 400k' having a thickness $t_2$ is formed. Accordingly, the thickness $t_2$ is less than the thickness $t_1$ shown in FIG. 4.

Figure 6:
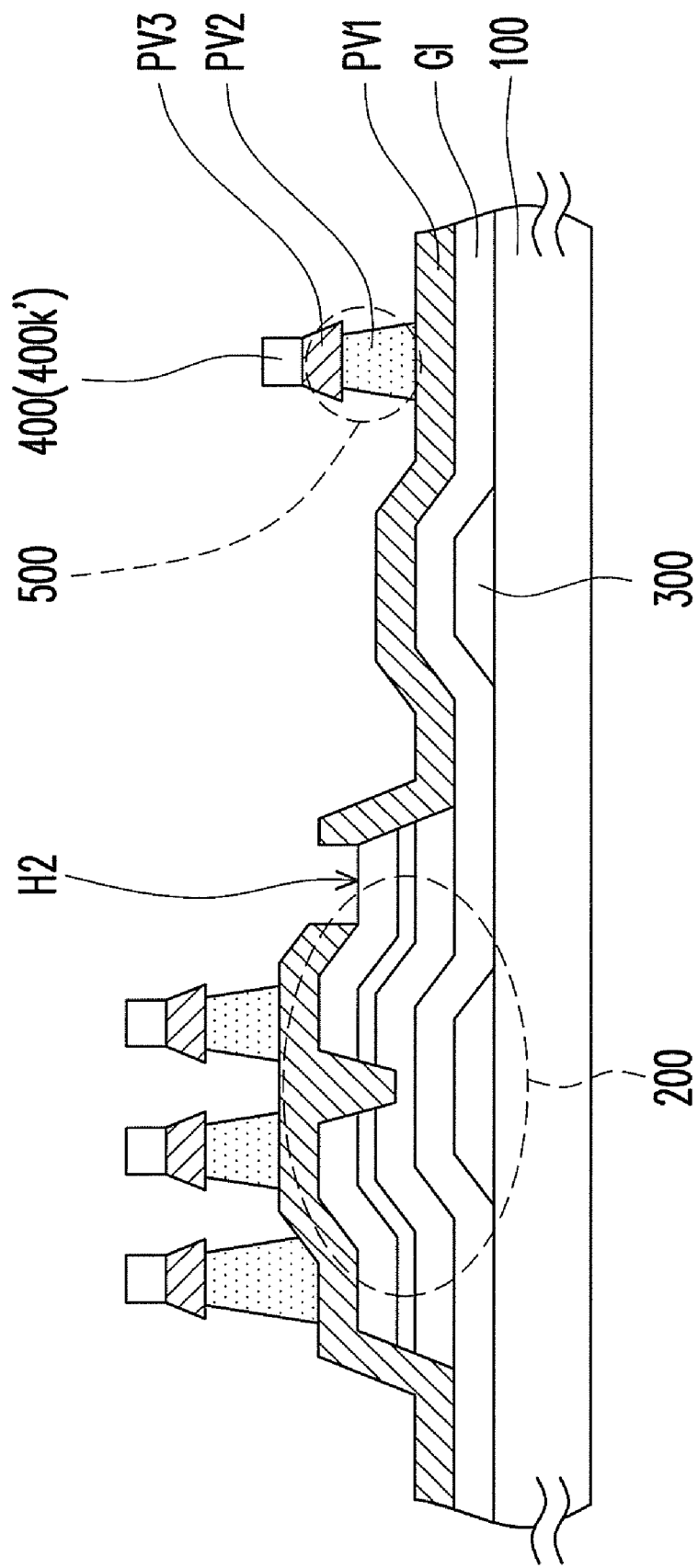

Next, the third dielectric layer PV3 and the second dielectric layer PV2 are patterned by using the remaining patterned photoresist layer 400 as a mask. Particularly, as shown in FIG. 6, an etching process is implemented by using the thick portion 400k' of the patterned photoresist layer 400 as the mask, so as to remove the exposed third dielectric layer PV3 and the exposed second dielectric layer PV2 and to form stacked structures 500. According to the present embodiment, the etching rate of the third dielectric layer PV3 is lower than that of the second dielectric layer PV2. Hence, the etched portion of the third dielectric layer PV3 is less than the etched portion of the second dielectric layer PV2 within the same time. As such, a width of the third dielectric layer PV3 is greater than a width of the second dielectric layer PV2. Moreover, the etching rate of the first dielectric layer PV1 is lower than that of the second dielectric layer PV2. Thus, by controlling manufacturing parameters, the second dielectric layer PV2 and the third dielectric layer PV3 that are not covered by the patterned photoresist layer 400 can be removed in the etching process without removing the first dielectric layer PV1.

In light of the foregoing, the relatively low etching rate of the third dielectric layer PV3 in comparison with the etching rate of the second dielectric layer PV2 contributes to the relatively great width of the third dielectric layer PV3 in comparison with the width of the second dielectric layer PV2 of the stacked structures 500. Further, the relatively low etching rate of the first dielectric layer PV1 in comparison with the etching rate of the second dielectric layer PV2 is conducive to stop etching on the first dielectric layer PV1 during the process of removing the third and the second dielectric layers PV3 and PV2.

Figure 7:
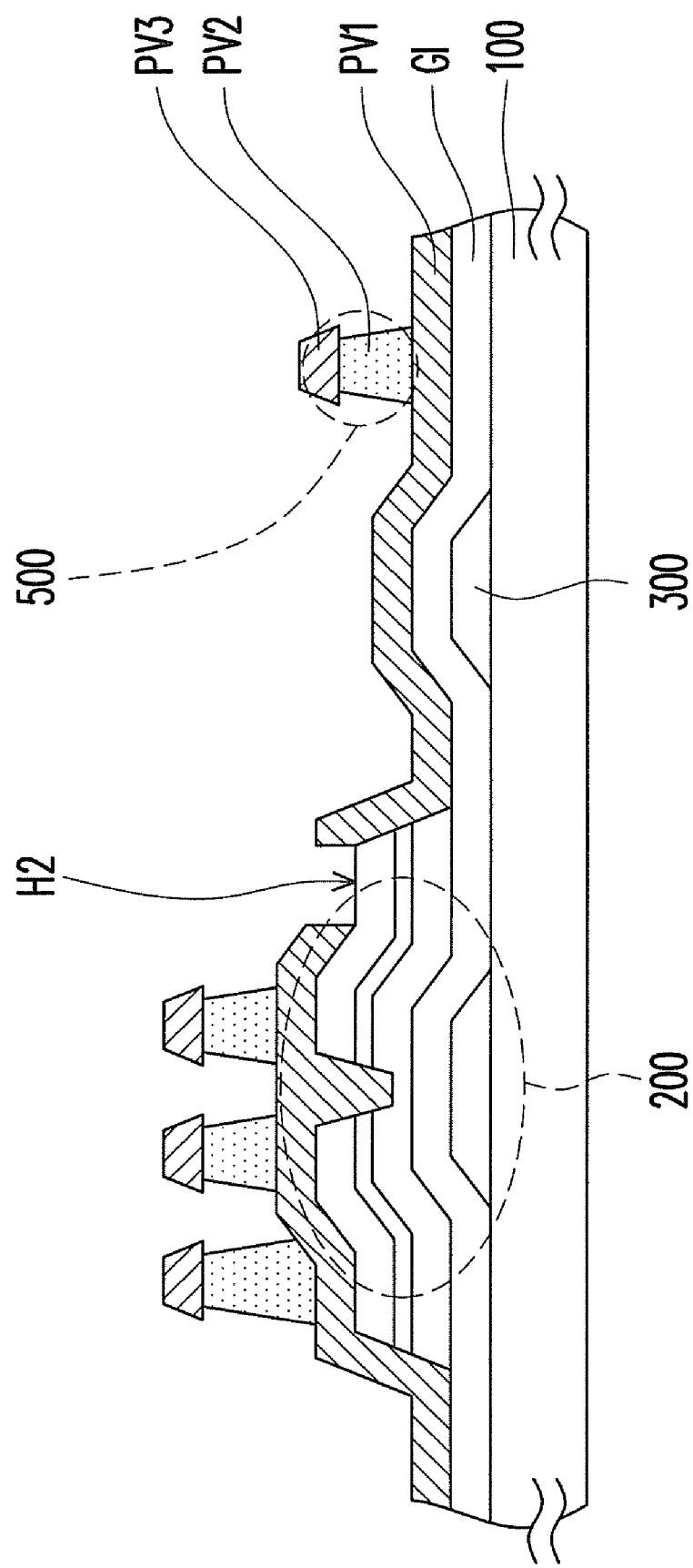
Figure 8:
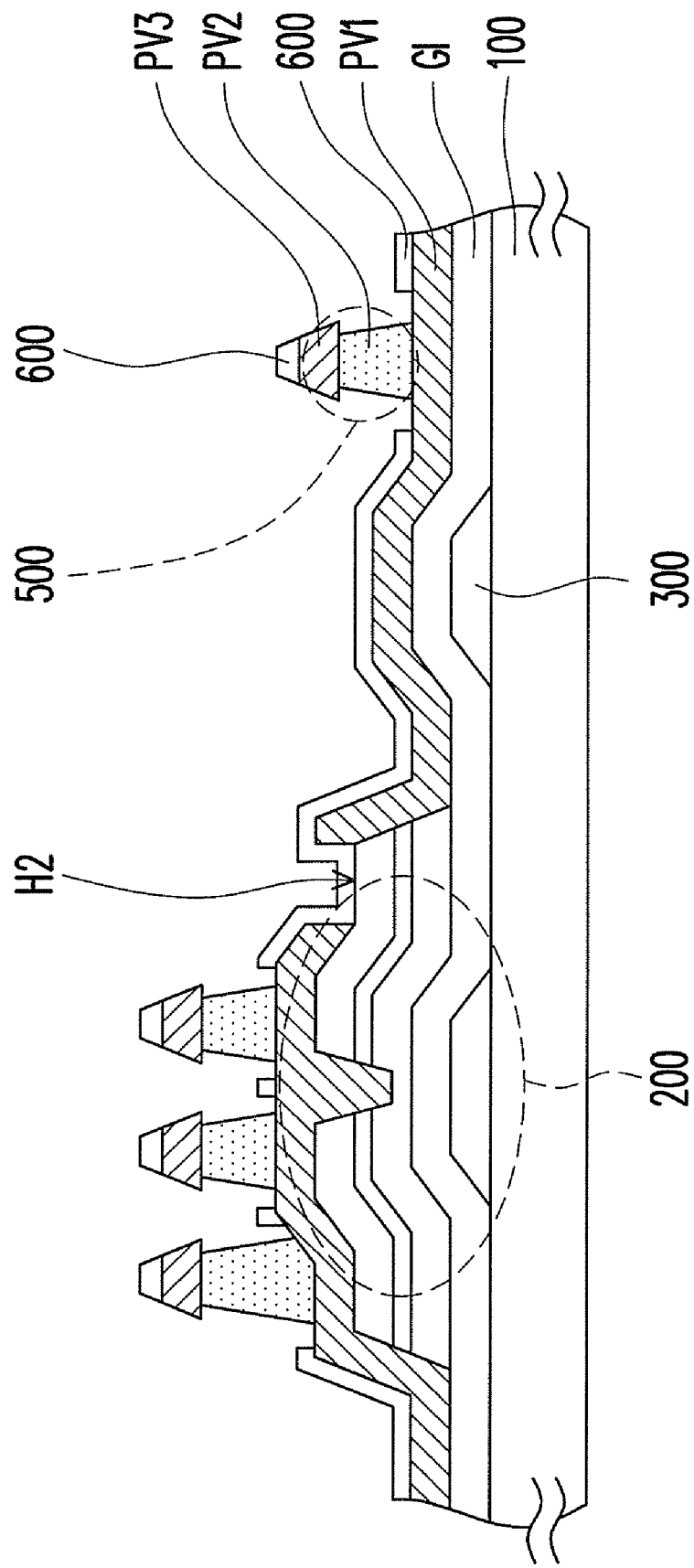

Afterwards, the patterned photoresist layer 400 is removed. Namely, as shown in FIG. 7, the remaining thick portion 400k' is removed. Thereafter, referring to FIG. 8, an electrode material layer 600 is formed above the substrate 100 for covering the stacked structures 500 and the first dielectric layer PV1. The contact opening H2 is filled with the electrode material layer 600. Here, the electrode material layer 600 is formed by forming an indium zinc oxide (ITO) layer or an indium zinc oxide (IZO) layer through performing a sputtering process. As indicated in FIG. 8, the stacked structures 500 in the present embodiment separate the electrode material layer 600 on the stacked structures 500 from the electrode material layer 600 on the first dielectric layer PV1. In other words, the design of the stacked structures 500 brings about the same effect that can be achieved by patterning the electrode material layer 600. Moreover, according to the present embodiment, the gate insulation layer GI and the first dielectric layer PV1 are interposed between the electrode material layer 600 and the electrode patterns 300, which constitutes a storage capacitor having a metal-insulator-ITO (MII) structure. However, the structure of the storage capacitor is not limited in the present invention.

Figure 9:
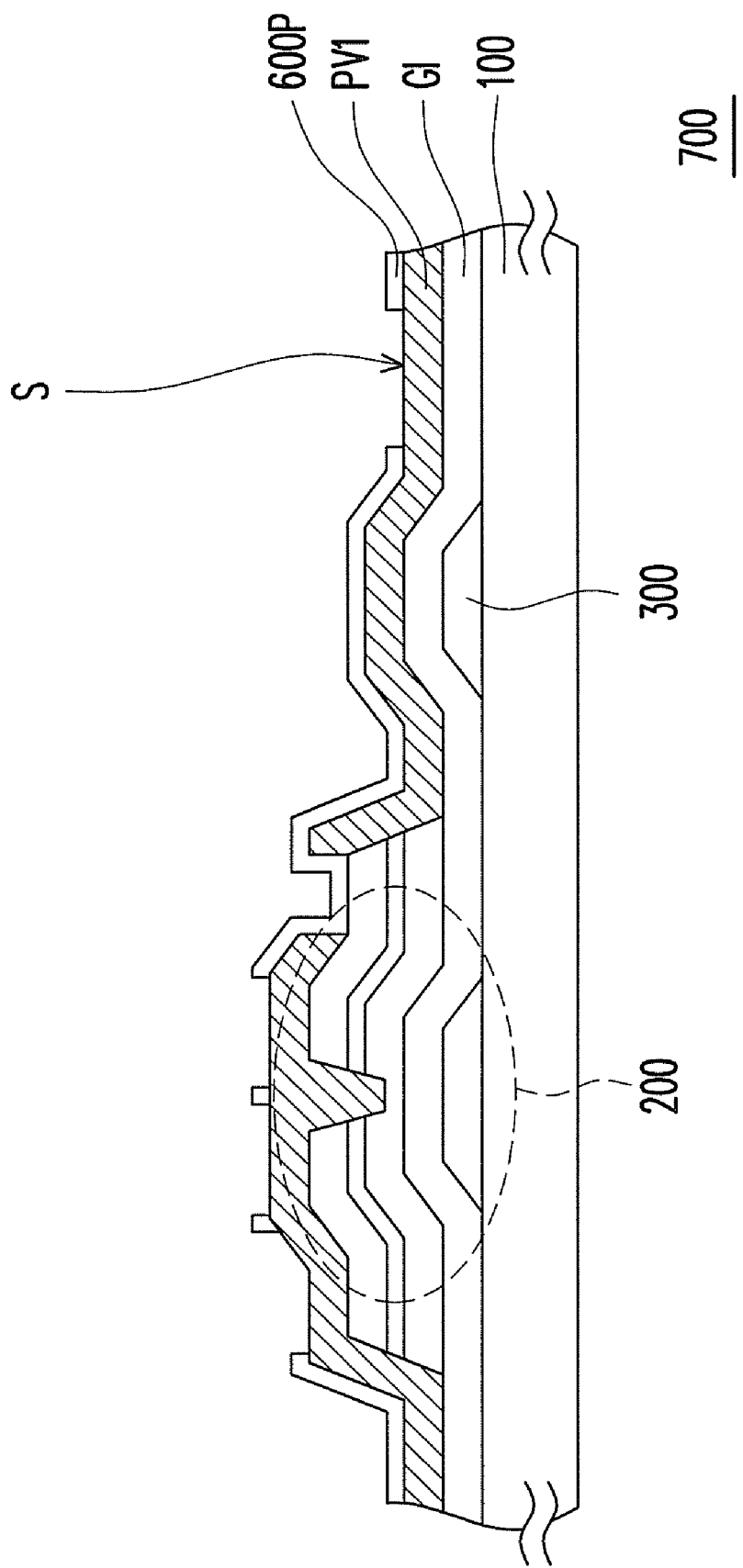

The stacked structures 500 and the electrode material layer 600 disposed thereon are then removed simultaneously, as shown in FIG. 9. In the present embodiment, the stacked structures 500 are, for example, removed by using an etching gas. For instance, a hydrofluoric (HF) acid etching gas can be used to remove the stacked structures 500 of which the first dielectric layer PV1, the second dielectric layer PV2, and the third dielectric layer PV3 are made of the silicon-based material. Nonetheless, in other embodiments, the stacked structures 500 can also be removed by using carbon dioxide in an equilibrium that solid, liquid and gas phases are coexist, that is, the carbon dioxide possesses penetration capacity of the gas phase, punching ability of the solid phase, and dissolution capability of the liquid phase. Therefore, after removal of the stacked structures 500, a pixel electrode 600p can be defined, and alignment slits S are simultaneously formed in the pixel electrode 600p. Note that only one exemplary alignment slit S is depicted in FIG. 9. In an LCD panel, the alignment slit S is suitable for tilting neighboring liquid crystal molecules towards a specific direction. Hence, a plurality of alignment slits S can tilt the liquid crystal molecules in different regions towards various directions, so as to achieve the wide-viewangle performance. It should be mentioned that the number of alignment slits S is determined upon actual demands on products, which should not be construed as a limitation to the present invention. Up to here, the fabrication of a pixel structure 700 in the present embodiment is approximately completed.

In the conventional method of manufacturing the pixel structure, two photomasks are required for respectively forming the pixel electrode and the contact opening of the dielectric layer. However, in the present embodiment, since the first, the second, and the third dielectric layers PV1, PV2, and PV3 have different etching rates, only one photomask is required for forming the contact opening H2 of the first dielectric layer PV1 and the pixel electrode 600p having at least one alignment slit S. Here, the pixel structure 700 having the alignment slits S can widen the viewing angle of the LCD panel. Hence, the required number of photomasks can be reduced in the present embodiment. In a preferred embodiment, when the formation of the active device 200 relies on the use of two photomasks, the pixel structure 700 can be formed by merely using three photomasks.

In the method of fabricating the pixel structure of the present invention, the first, the second, and the third dielectric layers having different etching rates can be used to define the pixel electrode with the alignment slits of the pixel structure. As such, the pixel structure formed by conducting the method of fabricating the pixel structure of the present invention can be applied to a wide-view-angle LCD panel. In addition, the contact opening and the pixel electrode in the pixel structure are formed with use of the same photomask, and therefore the required number of photomasks can be reduced by conducting the method of fabricating the pixel structure of the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a pixel structure, comprising:
   forming an active device on a substrate;
   sequentially forming a first dielectric layer, a second dielectric layer, and a third dielectric layer on the active device and the substrate, wherein etching rates of the first dielectric layer and the third dielectric layer are lower than an etching rate of the second dielectric layer;
   forming a contact opening in the third dielectric layer, the second dielectric layer, and the first dielectric layer, the contact opening exposing a portion of the active device;
   patterning the third dielectric layer and the second dielectric layer to form a plurality of stacked structures;
   forming an electrode material layer covering the plurality of stacked structures, the first dielectric layer, and the contact opening, wherein the electrode material layer located on the plurality of stacked structures and the electrode material layer located on the first dielectric layer are separated; and
   removing the plurality of stacked structures and the electrode material layer thereon simultaneously to define a pixel electrode and to form at least an alignment slit in the pixel electrode.

2. The method of fabricating the pixel structure as claimed in claim 1, wherein a width of the third dielectric layer of the plurality of stacked structures is greater than a width of the second dielectric layer of the plurality of stacked structures.

3. The method of fabricating the pixel structure as claimed in claim 1, wherein the steps of forming the contact opening and patterning the third dielectric layer and the second dielectric layer comprise:
   forming a patterned photoresist layer on the third dielectric layer, the patterned photoresist layer having a thin portion and a thick portion;
   forming the contact opening in the third dielectric layer, the second dielectric layer, and the first dielectric layer with use of the patterned photoresist layer as a mask;
   reducing a thickness of the patterned photoresist layer to remove the thin portion of the patterned photoresist layer and remain the thick portion of the patterned photoresist layer;
   removing the exposed third dielectric layer and the exposed second dielectric layer with use of the thick portion of the patterned photoresist layer as a mask to form the plurality of stacked structures; and
   removing the patterned photoresist layer.

4. The method of fabricating the pixel structure as claimed in claim 3, wherein the step of forming the patterned photoresist layer comprises using a half-tone mask or a gray-tone mask.

5. The method of fabricating the pixel structure as claimed in claim 1, wherein the first dielectric layer and the third dielectric layer have densities greater than a density of the second dielectric layer.

6. The method of fabricating the pixel structure as claimed in claim 5, wherein materials of the first dielectric layer and the third dielectric layer are the same as a material of the second dielectric layer.

7. The method of fabricating the pixel structure as claimed in claim 1, wherein materials of the first dielectric layer and the third dielectric layer are different from a material of the second dielectric layer.

8. The method of fabricating the pixel structure as claimed in claim 1, wherein the step of removing the plurality of stacked structures comprises using an etching gas.

9. The method of fabricating the pixel structure as claimed in claim 1, wherein the step of removing the plurality of stacked structures comprises using carbon dioxide in an equilibrium that solid, liquid and gas phases are coexist.

10. The method of fabricating the pixel structure as claimed in claim 1, wherein materials of the first dielectric layer, the second dielectric layer, and the third dielectric layer comprise silicon-based materials.

11. The method of fabricating the pixel structure as claimed in claim 10, wherein the step of removing the plurality of stacked structures comprises using a hydrofluoric acid etching gas.

* * * * *